(12) United States Patent
Son

(10) Patent No.: US 9,057,903 B2
(45) Date of Patent: Jun. 16, 2015

(54) FLAT PANEL DISPLAY

(71) Applicant: Samsung Display Co., Ltd., Yongin, Gyeonggi-Do (KR)

(72) Inventor: Yang-Han Son, Yongin (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 0 days.

(21) Appl. No.: 14/089,530

(22) Filed: Nov. 25, 2013

(65) Prior Publication Data

US 2014/0145167 A1 May 29, 2014

(30) Foreign Application Priority Data

Nov. 26, 2012 (KR) .................. 10-2012-0134803

(51) Int. Cl.
*H01J 1/62* (2006.01)
*H01J 63/04* (2006.01)
*G02F 1/1333* (2006.01)
*H01L 51/00* (2006.01)
*H01L 51/52* (2006.01)
*H01L 27/32* (2006.01)

(52) U.S. Cl.
CPC ...... *G02F 1/133308* (2013.01); *H01L 51/0097* (2013.01); *H01L 51/5284* (2013.01); *H01L 27/3244* (2013.01); *Y02E 10/549* (2013.01)

(58) Field of Classification Search
USPC .............................. 313/500–511; 257/40–100
See application file for complete search history.

(56) References Cited

U.S. PATENT DOCUMENTS

| 7,164,137 | B2* | 1/2007 | Hayashida | 250/370.11 |
|---|---|---|---|---|
| 8,466,613 | B2* | 6/2013 | Yee | 313/504 |
| 2006/0038132 | A1* | 2/2006 | Hayashida | 250/370.11 |
| 2009/0167171 | A1* | 7/2009 | Jung et al. | 313/504 |
| 2012/0056530 | A1* | 3/2012 | Yee | 313/504 |
| 2013/0170115 | A1* | 7/2013 | Jung et al. | 361/679.01 |

FOREIGN PATENT DOCUMENTS

| JP | 10-229255 A | 8/1998 |
|---|---|---|
| KR | 10-2008-0033974 A | 4/2008 |
| KR | 10-2009-0122762 A | 12/2009 |
| KR | 10-2010-0066883 A | 6/2010 |

* cited by examiner

*Primary Examiner* — Telly Green
(74) *Attorney, Agent, or Firm* — Knobbe, Martens, Olson & Bear, LLP

(57) ABSTRACT

A flat panel display such as an organic light emitting diode (OLED) display or a liquid crystal display (LCD) is disclosed. In one aspect, the OLED display includes: an OLED panel, a foam member attached to the bottom side of the panel by interposing an adhesive layer therebetween and a flexible circuit board electrically connected to the panel and curved and then attached to the foam member. The foam member includes a corresponding portion corresponding to the flexible circuit board and a non-corresponding portion not corresponding to the flexible circuit board, and the adhesive layer forms an air outlet path in at least the non-corresponding portion.

16 Claims, 8 Drawing Sheets

200

FLAT PANEL DISPLAY

RELATED APPLICATIONS

This application claims priority to and the benefit of Korean Patent Application No. 10-2012-0134803 filed in the Korean Intellectual Property Office on Nov. 26, 2012, the entire contents of which are incorporated herein by reference.

BACKGROUND

1. Field

The described technology generally relates to a flat panel display including a flexible circuit board in a bottom side of its display panel.

2. Description of the Related Technology

A flat panel display such as an organic light emitting diode (OLED) display or a liquid crystal display (LCD) has been widely applied to a mobile equipment such as a mobile phone, an ultra mobile personal computer (PC), an electronic book, and an electronic newspaper. The flat panel display generally includes a cover window in a front side of a display panel to protect the panel.

SUMMARY

One inventive aspect is a flat panel display including a flexible circuit board in a bottom side of its display panel.

Another aspect is an OLED display that can prevent generation of bubbles between an OLED panel and a foam member and preventing the foam member being lifted from the panel.

Another aspect is an OLED display which includes: an organic light emitting display panel; a foam member attached to the bottom side of the organic light emitting display panel by interposing an adhesive layer therebetween; and a flexible circuit board electrically connected to the organic light emitting display panel and bent and then attached to the foam member, the foam member comprises a corresponding portion corresponding to the flexible circuit board and a non-corresponding portion not corresponding to the flexible circuit board, and the adhesive layer forms an air outlet path in at least the non-corresponding portion.

The adhesive layer may be formed with a front coated portion in the corresponding portion and a pattern coated portion having the air outlet path in the non-corresponding portion.

The adhesive layer may be formed with a pattern coated portion having the air outlet path in a front side of the corresponding portion and a front side of the non-corresponding portion.

The OLED display may further include a double-sided adhesive member provided between the organic light emitting display panel and the foam member.

The adhesive layer may be formed in a side of the double-sided adhesive member, opposite to the organic light emitting display panel.

The adhesive layer may be formed with a front coated portion between the corresponding portion and the double-sided adhesive member that face each other and a pattern coated portion having the air outlet path between the non-corresponding portion and the double-sided adhesive member that face each other.

The air outlet path may be formed with a mesh structure on the double-sided adhesive member.

The adhesive layer may be formed with a pattern coated portion having the air outlet path between a front side of the foam member and the double-sided adhesive member that face each other.

Another aspect is an OLED display which includes: an OLED panel; a foam member attached to a bottom side of the OLED panel by interposing an adhesive layer therebetween; and a flexible circuit board electrically connected to the OLED panel and bent to be attached to the foam member, and the adhesive layer includes a first adhering portion corresponding to the flexible circuit board and having first adhesion strength and a second adhering portion corresponding to portions excluding the flexible circuit board and having second adhesion strength that is less than the first adhesion strength.

The adhesive layer may form an air outlet path in the second adhering portion.

The adhesive layer may further form an air outlet path in the first adhering portion.

The OLED display may further include a double-sided adhesive member provided between the OLED panel and the foam member.

The adhesive layer may be formed in a side of the double-sided adhesive member, opposite to the OLED panel.

The adhesive layer may form a front coated portion with the first adhering portion and a pattern coated portion with the second adhering portion.

The adhesive layer may form a pattern coated portion with the first adhering portion and the second adhering portion.

DETAILED DESCRIPTION

Figure 1:
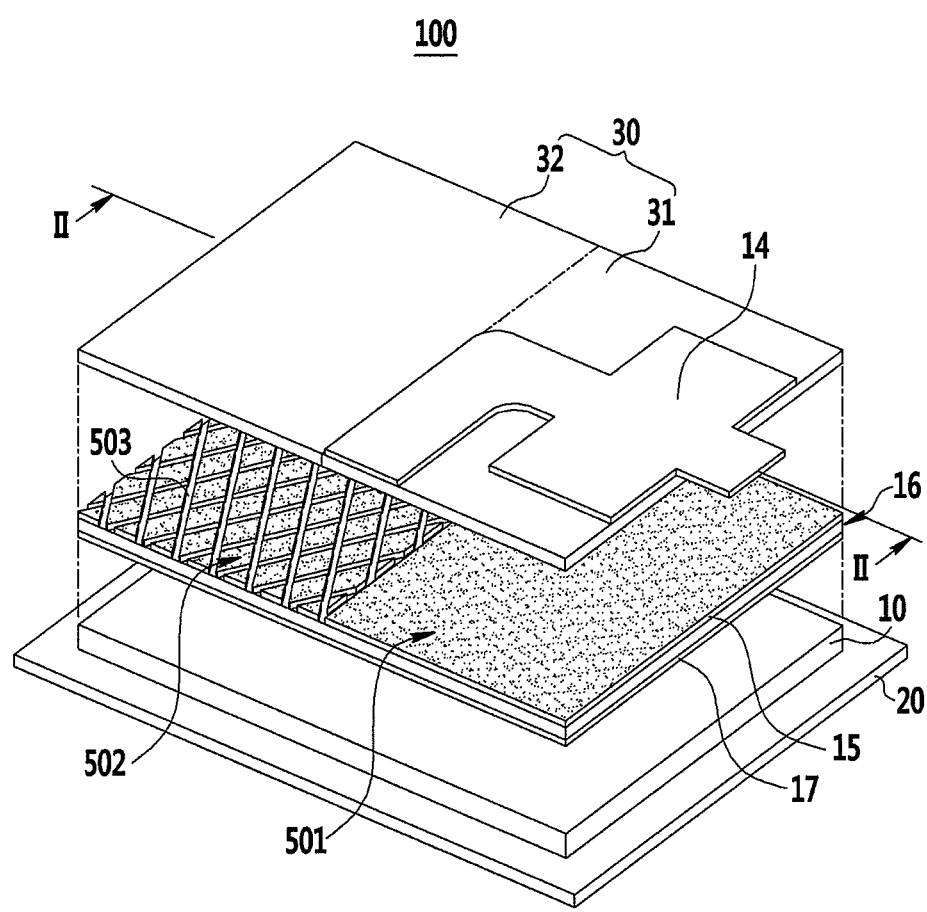
FIG. 1 is an exploded perspective view of an OLED display according to a first exemplary embodiment.

Generally, an OLED display blocks external light transmitted from a bottom side thereof by attaching a black tape to the bottom side, and absorbs external impact by attaching a foam member to the black tape.

A flexible circuit board connected to the OLED panel is attached to the foam member. Since the black tape includes an adhesive layer in a front thereof, bubbles generated from an interface when attaching the foam member to the black tape can be maintained.

One side of the flexible circuit board is connected to the OLED panel and the other side thereof is attached to the foam member. Thus, tension is formed in the bending portion of the flexible circuit board, and the tension may cause the foam member to which the flexible circuit board is attached may be lifted.

Embodiments will be described more fully hereinafter with reference to the accompanying drawings. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification. Further, in the drawings, a size and thickness of each element are randomly represented for better understanding and ease of description, and the present invention is not limited thereto.

In the drawings, the thickness of layers, films, panels, regions, etc., may be exaggerated for clarity. In the drawings, for better understanding and ease of description, thicknesses of some layers and areas may be excessively displayed. It will be understood that when an element such as a layer, film, region, or substrate is referred to as being "on" another element, it can be directly on the other element or intervening elements may also be present.

FIG. 1 is an exploded perspective view of an OLED display 100 according to a first exemplary embodiment. Referring to FIG. 1, the OLED display 100 includes an OLED panel 10, a cover window 20 stacked in a front surface of the OLED panel 10 to protect the same, a foam member 30 provided in a bottom surface of the OLED panel 10, and a flexible circuit board 14 electrically connected to the OLED panel 10 and bent to be attached to the foam member 30.

The OLED panel 10 may include a flexible film such as a plastic film, and display an image by arranging an OLED and a pixel circuit on the flexible film. A detailed structure of the OLED panel 10 will be described later.

The cover window 20 is provided in the outside of the front surface where an image is displayed in the OLED panel 10, and is formed of a transparent hard material to transmit the image of the OLED panel 10 and protect the OLED panel 10 against external impact.

A touch panel (not shown) that senses touching operation of a user may be disposed between the OLED panel 10 and the cover window 20. For example, the touch panel may be disposed between a polarizing plate and the cover window 20.

The foam member 30 is attached to the bottom surface of the OLED panel 10 by interposing an adhesive layer 15 therebetween. For example, the foam member 30 is attached to the bottom surface of the OLED panel 10 by interposing a double-sided adhesive member 16 therebetween.

The foam member 30 can absorb external impact in the bottom side of the OLED panel 10. The double-sided adhesive member 16 is formed as a black tape to block external light transmitted from the bottom surface of the OLED panel 10.

The double-sided adhesive member 16 forms an adhesive layer in one side as the adhesive layer 15, and further includes an adhesive layer 17 in the opposite side thereof. The adhesive layer 15 bonded with the foam member 30 is formed in a side of the double-sided adhesive member 16, disposed opposite to the OLED panel 10.

The flexible circuit board 14 is formed to control the OLED panel 10 and the touch panel to be attached to the bottom surface of the foam member 30. For example, the flexible circuit board 14 may be attached to the foam member 30 by a double-sided adhesive tape (not shown).

The foam member 30 includes a corresponding portion 31 that corresponds to the attached flexible circuit board 14 and a non-corresponding portion 32 that does not correspond to the flexible circuit board 14. The adhesive layer 15 forms an air outlet path 503 in the non-corresponding portion 32 of the foam member 30. The air outlet path 503 may be formed with a mesh structure on the double-sided adhesive member 16.

When the foam member 30 is attached to the adhesive layer 15, the air outlet path 503 provided in the adhesive layer 15 can emit bubbles generated between the adhesive layer 15 and the foam member 30. When the foam member 30 is attached to the adhesive layer 15, the air outlet path 503 may be maintained or partially buried by an adhesive from adhesive layer 15.

That is, the adhesive layer 15 forms a first adhering portion 501 having first adhesion strength between the corresponding portion 31 and the double-sided adhesive member 16, and forms a second adhering portion 502 having second adhesion strength between the non-corresponding portion 32 and the double-sided adhesive member 16.

The first adhering portion 501 may form the first adhesion strength by forming a front coated portion entirely coated with an adhesive, and the second adhering portion 502 may form the second adhesion strength by forming a pattern coated portion coated by forming patterns of the air outlet path 503.

In one embodiment, the second adhesion strength of the second adhering portion 502 is set to be less than the first adhering strength of the first adhering portion 501 due to the air outlet path 503. In the first exemplary embodiment, the first adhering strength of the first adhering portion 501 is stronger than the second adhesion strength of the second adhering portion 502.

Figure 2:
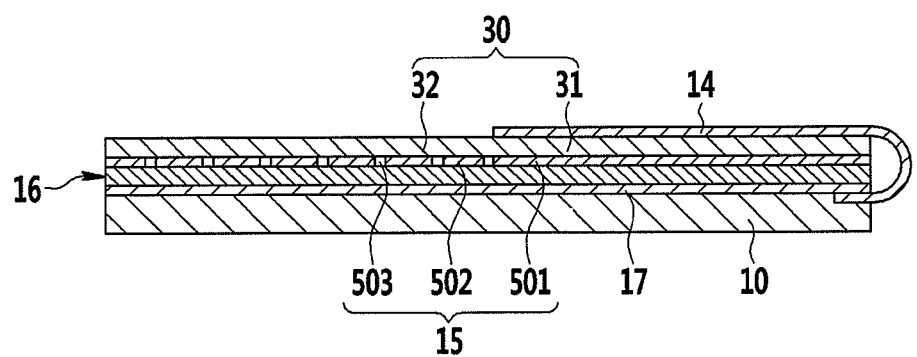
FIG. 2 is a cross-sectional view of FIG. 1, taken along the line II-II.

FIG. 2 is a cross-sectional view of FIG. 1, taken along the line II-II. Referring to FIG. 2, the flexible circuit board 14 is attached to the corresponding portion 31 of the foam member 30 and then bent so that the flexible circuit board 14 is electrically connected to the OLED panel 10.

The corresponding portion 31 of the foam member 30 is attached to the double-sided adhesive member 16 with strong adherence by the first adhering portion 501 of the adhesive layer 15. Thus, although tension is intensely applied to the corresponding portion 31 of the foam member 30 due to the bending of the flexible circuit board 14, the corresponding portion 31 of the foam member 30 can be firmly attached without being lifted from the adhesive layer 15 and the OLED panel 10.

In addition, the non-corresponding portion 32 of the foam member 30 is attached to the double-sided adhesive member 16 by the second adhering portion 502 of the adhesive layer 15. Since tension due to the bending of the flexible circuit board 14 is not intensely applied to the non-corresponding portion 32, the foam member 30 can be attached to the double-sided adhesive member 16 by the second adhering portion 502 with insignificant adherence.

Hereinafter, various exemplary embodiments will be described. A description of the same constituent elements as those of the first exemplary embodiment and other exemplary embodiments will be omitted.

Figure 3:
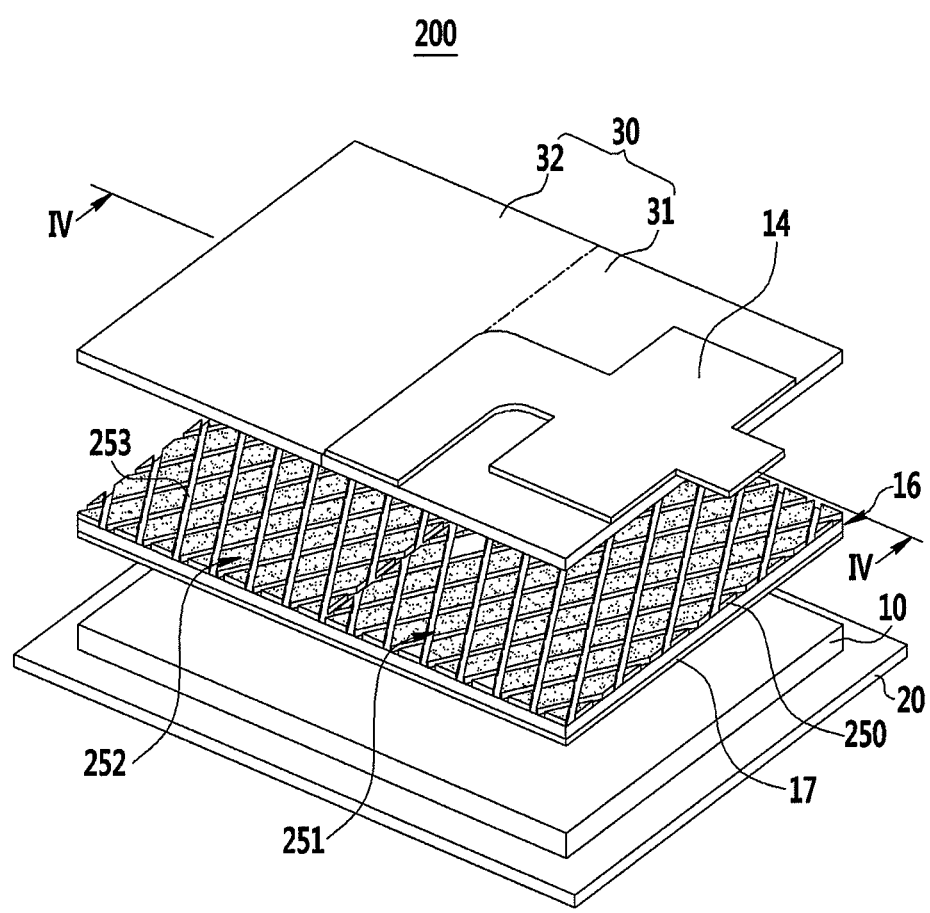
FIG. 3 is an exploded perspective view of an OLED display according to a second exemplary embodiment.
Figure 4:
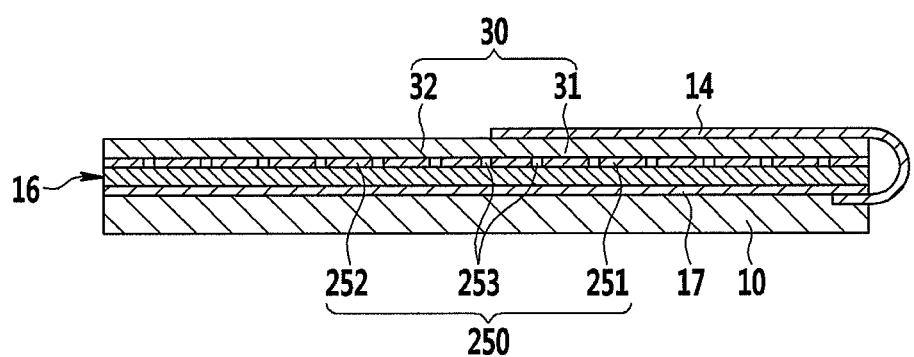
FIG. 4 is a cross-sectional view of FIG. 3, taken along the line IV-IV.

FIG. 3 is an exploded perspective view of an OLED display 200 according to a second exemplary embodiment and FIG. 4 is a cross-sectional view of FIG. 3, taken along the line IV-IV. Referring to FIG. 3 and FIG. 4, an adhesive layer 250 forms a first adhering portion 251 and a second adhering portion 252 with a pattern coated portion having an air outlet path 253 between a front side of a foam member 30 and a double-sided adhesive member 16.

The pattern coated portion is formed by forming a pattern of the air outlet path 253 and being coated with the pattern so that the first and second adhering portions 251 and 252 may have adhesion strength corresponding to the second adhering strength of the first exemplary embodiment.

When the foam member 30 is attached to the adhesive layer 250, the air outlet path 253 provided in the adhesive layer 250 may emit bubbles generated between the adhesive layer 250 and the foam member 30. When the foam member 30 is attached to the adhesive layer 250, the air outlet path 253 may be maintained or partially buried by an adhesive from the adhesive layer 250.

Since the air outlet path 253 is formed in the first adhering portion 251 and the second adhering portion 252, the air outlet path 253 provided in the adhesive layer 250 can further effectively emit bubbles generated between the adhesive layer 250 and the foam member 30 when attaching the foam member 30 to the adhesive layer 250.

A corresponding portion 31 and a non-corresponding portion 32 are attached to the double-sided adhesive member 16 with strong adherence by the first and second adhering portions 251 and 252. Thus, although tension is intensely applied to the corresponding portion 31 of the foam member 30 due to the bending of the flexible circuit board 14, the corresponding portion 31 of the foam member 30 can be firmly attached without being lifted from the adhesive layer 250 and OLED panel 10.

The OLED displays 100 and 200 of the first and second exemplary embodiments are provided with the double-sided adhesive member 16, and forms the adhesive layers 15 and 250 in one side of the double-sided adhesive member 16. On the contrary, an OLED display 300 of the third exemplary embodiment is not provided with a double-sided adhesive member, and forms an adhesive layer 350 in a foam member 30. That is, foam members 30 of the third and fourth exemplary embodiments are directly attached to the bottom side of the OLED panel 10 by interposing the adhesive layers 350 and 450 therebetween (refer to FIG. 5 and FIG. 6).

Figure 5:
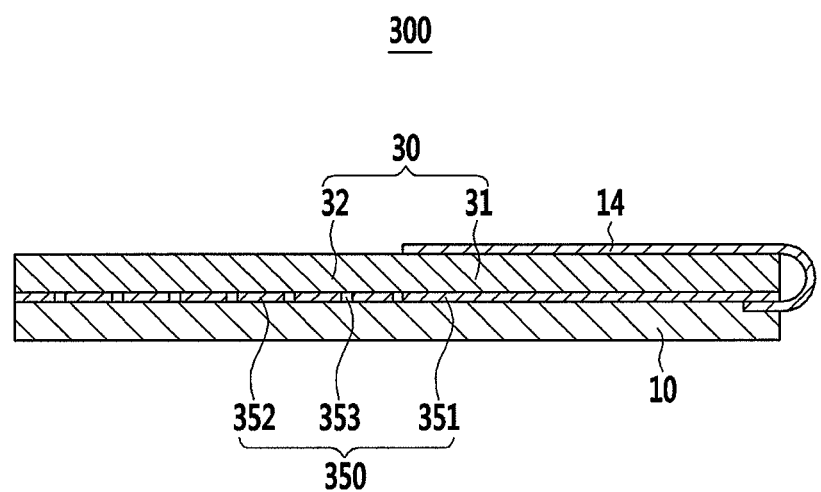
FIG. 5 is a cross-sectional view of an OLED display according to a third exemplary embodiment.

FIG. 5 is a cross-sectional view of the OLED display according to the third exemplary embodiment. Referring to FIG. 5, the adhesive layer 350 forms a first adhesive portion 351 with a front coated portion in the corresponding portion 31 of the foam member 30, and forms a second adhesive portion 352 with a pattern coated portion having the air outlet path 353 in the non corresponding portion 32.

When the foam member 30 having the adhesive layer 350 is attached to the OLED panel 10, the air outlet path 353 provided in the adhesive layer 350 can emit bubbles generated between the foam member 30 and the OLED panel 10. When the foam member 30 having the adhesive layer 350 is attached to the OLED panel 10, the air outlet path 353 may be maintained or may be partially buried by an adhesive from the adhesive layer 350.

Since the air outlet path 353 is formed in the second adhering portion 352, the air outlet path 353 provided in the adhesive layer 350 can further effectively emit bubbles generated between the OLED panel 10 and foam member 30 when attaching the foam member 30 having the adhesive layer 350 to the OLED panel 10.

Thus, the corresponding portion 31 and the non-corresponding portion 32 of the foam member 30 are attached to the OLED panel 10 with strong adherence by the first and second adhering portions 351 and 352. Thus, although tension is intensely applied to the corresponding portion 31 of the foam member 30 due to the bending of the flexible circuit board 14, the corresponding portion 31 of the foam member 30 can be firmly attached without being lifted from the adhesive layer 350 and the OLED panel 10.

In addition, the non-corresponding portion 32 of the foam member 30 is attached to the OLED panel 10 by the second adhering portion 352 of the adhesive layer 350. Since tension due to the bending of the flexible circuit board 14 is not intensely applied to the non-corresponding portion 32, the foam member 30 can be attached to the OLED panel 10 by the second adhering portion 352 with insignificant adherence.

Figure 6:
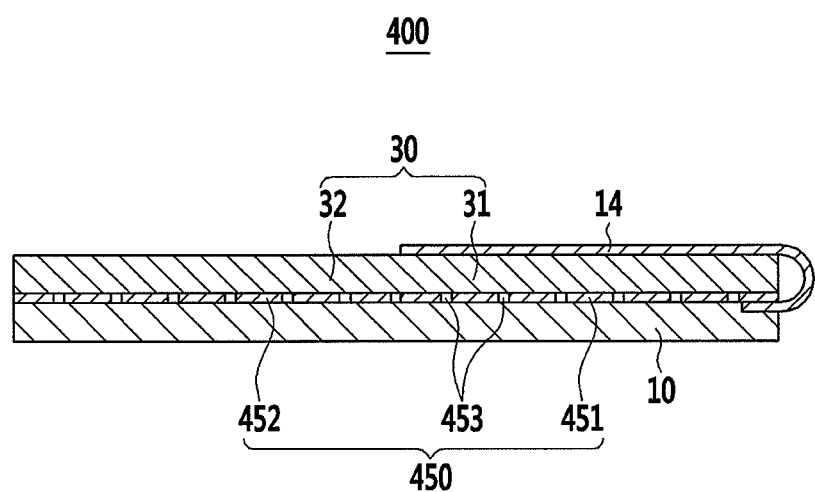
FIG. 6 is a cross-sectional view of an OLED display according to a fourth exemplary embodiment.

FIG. 6 is a cross-sectional view of an OLED display 400 according to a fourth exemplary embodiment. Referring to FIG. 6, an adhesive layer 450 forms a first adhering portion 451 and a second adhering portion 452 with a pattern coated portion having an air outlet path 453 between a front surface of a foam member 30 and an OLED panel 10.

When the foam member 30 having the adhesive layer 450 is attached to the OLED panel 10, the air outlet path 453 provided in the adhesive layer 450 can emit bubbles generated between the foam member 30 and the OLED panel 10. When attaching the foam member 30 having the adhesive layer 450 to the OLED panel 10, the air outlet path 453 may be maintained or partially buried by an adhesive from the adhesive layer 450.

Since the air outlet path 453 is formed in the second adhering portion 452, the air outlet path 453 provided in the adhesive layer 450 can further effectively emit bubbles generated between the OLED panel 10 and the foam member 30 when attaching the foam member 30 having the adhesive layer 450 to the OLED panel 10.

A corresponding portion 31 and a non-corresponding portion 32 are attached to the OLED panel 10 with strong adherence by the first and second adhering portions 451 and 452. Thus, although tension is intensely applied to the corresponding portion 31 of the foam member 30 due to the bending of the flexible circuit board 14, the corresponding portion 31 of the foam member 30 can be firmly attached without being lifted from the adhesive layer 450 and the OLED panel 10.

Hereinafter, the OLED panel 10 disposed between the cover window 20 and the adhesive layers 15, 250, 350, and 450 will be described with examples.

Figure 7:
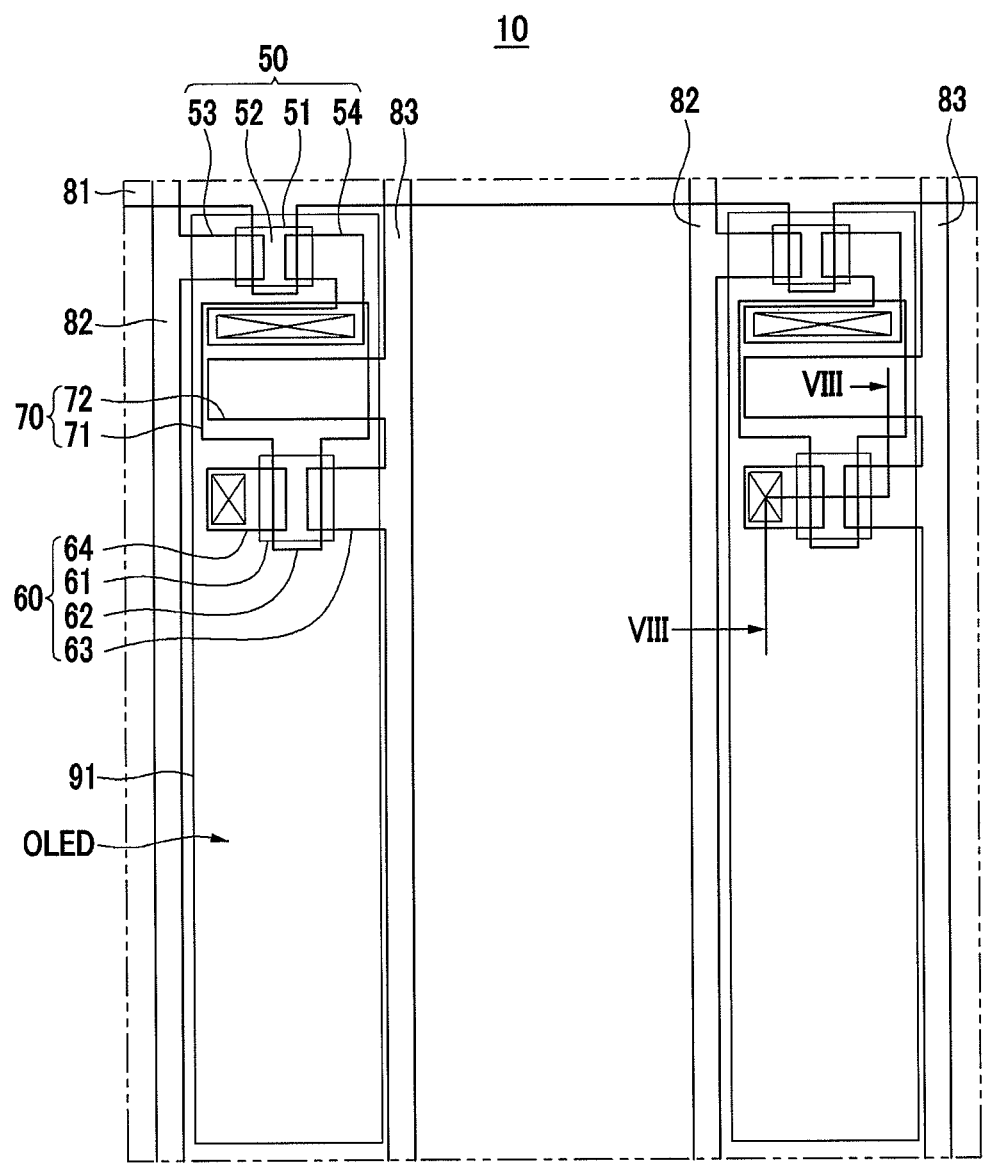
FIG. 7 is a layout view of a pixel structure of an OLED panel shown in FIG. 1.
Figure 8:
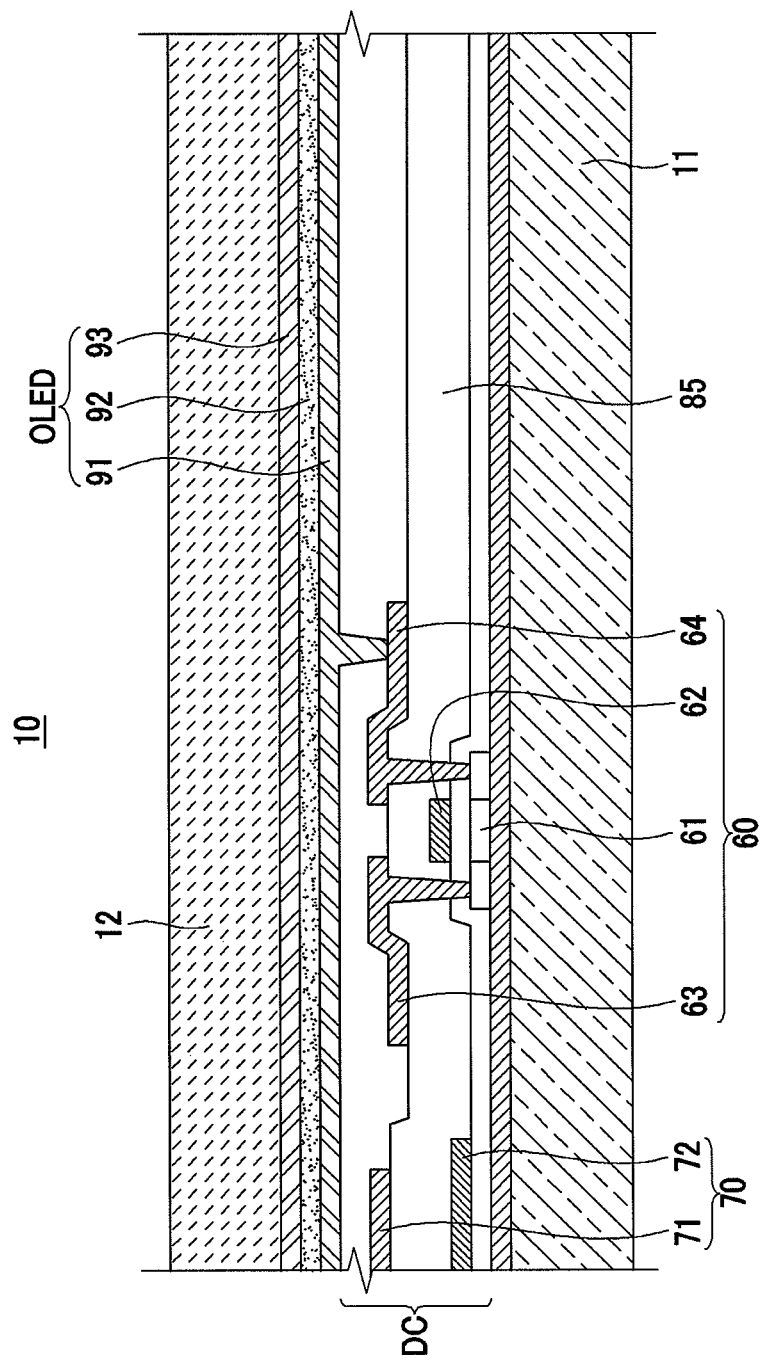
FIG. 8 is a cross-sectional view of the OLED panel of FIG. 7, taken along the line VIII-VIII.

FIG. 7 is a layout view of a pixel structure of the OLED panel of FIG. 1, and FIG. 8 is a cross-sectional view of the OLED panel of FIG. 7, taken along the line VIII-VIII. Although the OLED panel 10 has been described, a flexible liquid crystal display can also be used.

Referring to FIG. 7 and FIG. 8, the OLED panel 10 includes a pixel circuit DC and an OLED formed in each pixel. The pixel circuit DC basically includes a switching thin film transistor 50, a driving thin film transistor 60, and a capacitor 70. In addition, the OLED panel 10 includes a gate line 81 extended along one direction, a data line 82, and a common power line 83. The data line 82 and the common power line 83 cross the gate line 81 in an insulated manner.

Here, one pixel may be defined by a boundary of the gate line 81, the data line 82, and the common power line 83, but is not necessarily limited thereto. The pixel means a basic unit that displays an image. The OLED panel 10 displays an image through a plurality of pixels.

In FIG. 7, an active matrix OLED panel 10 of a 2Tr-1 Cap structure in which two thin film transistors which are the switching thin film transistor 50 and the driving thin film transistor 60 and one capacitor 70 are provided in one pixel is illustrated. However, the structure of the OLED panel 10 is not limited to the illustrated example. The OLED panel 10 may include no less than three thin film transistors and no less than two capacitors. An additional wire may be further formed in the OLED panel 10 so that the OLED panel 10 may have various structures.

The OLED includes a pixel electrode 91, an organic emission layer 92, and a common electrode 93. One of the pixel electrode 91 and the common electrode 93 is a hole injection electrode and the other is an electron injection electrode. Light is emitted when electrons and holes are injected from the pixel electrode 91 and the common electrode 93 into the organic emission layer 92 and exciton in which the holes and the electrons are combined with each other is reduced from an exited state to a base state.

The organic emission layer 92 is made of a low polymer organic material or a high polymer organic material such as poly3,4-ethylene dioxythiophene (PEDOT). In addition, the organic emission layer 92 may be formed as a multilayer including at least one of an emission layer, a hole injection layer (HIL), a hole transporting layer (HTL), an electron transporting layer (ETL), and an electron injection layer (EIL). When the multilayer includes all of the emission layers HIL, HTL, ETL, and EIL, the HIL is disposed on the pixel electrode 91, which is a positive electrode, and the HTL, the emission layer, the ETL, and the EIL are sequentially stacked thereon.

The organic emission layer 92 may include a red color organic emission layer emitting light of a red color, a green organic emission layer emitting light of a green color, and a blue organic emission layer emitting light of a blue color, and the red organic emission layer, the green organic emission layer, and the blue organic emission layer are respectively formed in a red color pixel, a green color pixel, and a blue color pixel to realize a colored image.

In addition, the organic emission layer 92 layers the red organic emission layer, the green organic emission layer, and the blue organic emission layer together in the red color pixel, the green color pixel, and the blue color pixel, and a red color filter, a green color filter, and a blue color filter are provided in the respective pixels to realize a colored image. Alternatively, a white organic emission layer emitting light of a white color is formed all in the red color pixel, the green color pixel, and the blue color pixel, and a red color filter, a green color filter, and a blue color filter are provided in the respective pixels to realize a colored image. When a colored image is realized using the white organic emission layer and color filters, deposition masks for deposition of the red organic emission layer, the green organic emission layer, and the blue organic emission layer to the respective pixels, that is, the red color pixel, the green color pixel, and the blue color pixels are not needed.

In other examples, it is a matter of course that the white organic emission layer may be formed as one organic emission layer, and the white organic emission layer includes a configuration capable of emitting white light by stacking the plurality of organic emission layers. For example, the white organic emission layer may also include a configuration capable of emitting light of a white color by combining at least one yellow organic emission layer and at least one blue organic emission layer, a configuration capable of emitting light of a white color by combining at least one cyan organic emission layer and at least one red organic emission layer, and a configuration capable of emitting light of a white color by combining at least one magenta organic emission layer and at least one green organic emission layer.

The pixel electrode 91 is formed of a metal having high reflectance and the common electrode 93 may be formed of a transparent conductive layer. In this case, the light of the organic emission layer 92 is reflected by the pixel electrode 91 and transmits the common electrode 93 and an encapsulation substrate 12 to be emitted to the outside. In FIG. 8, reference numeral 11 denotes a flexible substrate.

The capacitor 70 includes a pair of capacitor electrodes 71 and 72 disposed with an interlayer insulating layer 85 as a dielectric material interposed therebetween. Capacitance of the capacitor 70 is determined by a voltage between an electric charge charged in the capacitor 70 and a voltage between the two capacitor electrodes 71 and 72.

The switching thin film transistor 50 includes a switching semiconductor layer 51, a switching gate electrode 52, a switching source electrode 53, and a switching drain electrode 54. The driving thin film transistor 60 includes a driving semiconductor layer 61, a driving gate electrode 62, a driving source electrode 63, and a driving drain electrode 64.

The switching semiconductor layer 51 and the driving semiconductor layer 61 may be formed of a polysilicon or oxide semiconductor. The oxide semiconductor may include at least one of oxides based on titanium (Ti), hafnium (Hf), zirconium (Zr), aluminum (Al), tantalum (Ta), germanium (Ge), zinc (Zn), gallium (Ga), tin (Sn), or indium (In) and complex oxides thereof, such as zinc oxide (ZnO), indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O).

The switching semiconductor layer 51 and the driving semiconductor layer 61 each include a channel region not doped with impurities and source and drain regions doped with impurities and formed at both sides of the channel region. Here, the impurity is changed according to the type of a thin film transistor, and N-type impurities or P-type impurities are applicable.

When the switching semiconductor layer 51 and the driving semiconductor layer 61 are formed of oxide semiconductors, an additional protection layer may be added to protect the oxide semiconductor that is weak to external environment, e.g., a high temperature.

The switching thin film transistor 50 is used as a switch to select a pixel for light emission. The switching gate electrode 52 is connected to the gate line 81. The switching source electrode 53 is connected to the data line 82, and the switching drain electrode 54 is connected to one capacitor electrode 71.

The driving thin film transistor 60 applies a driving power for light emission of an organic emission layer 92 of the selected pixel to the pixel electrode 91. The driving gate electrode 62 is connected with the capacitor electrode 71 connected with the switching drain electrode 54. The driving source electrode 63 and the other capacitor electrode 72 are connected with the common power line 83. The driving drain electrode 64 is connected with the pixel electrode 91 of the organic light emitting diode OLED through a contact hole.

The switching thin film transistor 50 is driven by a gate voltage applied from the gate line 81 to transmit a data voltage applied from the data line 82 to the driving thin film transistor 60. A voltage corresponding to a difference between a common voltage applied to the driving thin film transistor 60 from the common power line 83 and the data voltage transmitted from the switching thin film transistor 50 is stored in the capacitor 70, and a current corresponding to the voltage stored in the capacitor 70 flows to the organic light emitting diode OLED through the driving thin film transistor 60 such that the organic emission layer 92 emits light.

According to at least one of the above embodiments, the air outlet path is formed in the adhesive layer provided between the OLED panel and the foam member and thus, when the foam member is attached to the OLED panel, generation of bubbles between the OLED panel and the foam member can be suppressed by emitting air through the air outlet path. Thus, the foam member can be firmly attached to the OLED panel. That is, when the flexible circuit board is attached in a bent manner to the foam member, the foam member can be firmly attached without being lifted from the OLED panel.

While the above embodiments have been described in connection with the accompanying drawings, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
    an OLED panel;
    a foam member attached to the OLED panel, wherein an adhesive layer is interposed between the foam member and the OLED panel; and
    a flexible circuit board electrically connected to the OLED panel and curved and attached to the foam member,
    wherein the foam member comprises a corresponding portion corresponding to the flexible circuit board and a non-corresponding portion not corresponding to the flexible circuit board, and
    wherein the adhesive layer forms an air outlet path in at least the non-corresponding portion.

2. The OLED display of claim 1, wherein the adhesive layer comprises a front coated portion in the corresponding portion and a pattern coated portion having the air outlet path in the non-corresponding portion.

3. The OLED display of claim 1, wherein the adhesive layer comprises a pattern coated portion having the air outlet path in a front side of the corresponding portion and a front side of the non-corresponding portion.

4. The OLED display of claim 1, wherein the adhesive layer comprises a double-sided adhesive member.

5. The OLED display of claim 4, wherein the adhesive layer is formed in a side of the double-sided adhesive member, opposite to the OLED panel.

6. The OLED display of claim 5, wherein the adhesive layer comprises i) a front coated portion between the corresponding portion and the double-sided adhesive member that face each other and ii) a pattern coated portion having the air outlet path between the non-corresponding portion and the double-sided adhesive member that face each other.

7. The OLED display of claim 6, wherein the air outlet path has a mesh structure on the double-sided adhesive member.

8. The OLED display of claim 5, wherein the adhesive layer comprises a pattern coated portion having the air outlet path between a front side of the foam member and the double-sided adhesive member that face each other.

9. An organic light emitting diode (OLED) display comprising:
    an OLED panel;
    a foam member attached to the OLED panel, wherein an adhesive layer is interposed between the foam member and the OLED panel; and
    a flexible circuit board electrically connected to the OLED panel and curved to be attached to the foam member,
    wherein the adhesive layer comprises:
    a first adhering portion corresponding to the flexible circuit board and having first adhesion strength; and
    a second adhering portion corresponding to portions excluding the flexible circuit board and having second adhesion strength that is less than the first adhesion strength, wherein the adhesive layer forms an air outlet path in the second adhering portion.

10. The OLED display of claim 9, wherein the adhesive layer further forms an air outlet path in the first adhering portion.

11. The OLED display of claim 9, wherein the adhesive layer comprise a double-sided adhesive member.

12. The OLED display of claim 11, wherein the adhesive layer is formed in a side of the double-sided adhesive member, opposite to the OLED panel.

13. The OLED display of claim 11, wherein the adhesive layer forms a front coated portion with the first adhering portion and a pattern coated portion with the second adhering portion.

14. The OLED display of claim 11, wherein the adhesive layer forms a pattern coated portion with the first adhering and the second adhering portion.

15. A flat panel display comprising:
    a display panel;
    a foam member attached to the display panel, wherein an adhesive layer is interposed between the foam member and the display panel; and
    a flexible circuit board electrically connected to the display panel and curved and attached to the foam member,
    wherein the foam member comprises a corresponding portion corresponding to the flexible circuit board and a non-corresponding portion not corresponding to the flexible circuit board, and
    wherein the adhesive layer forms an air outlet path in at least the non-corresponding portion.

16. The flat panel display of claim 15, wherein the display panel is an organic, light emitting diode (OLED) display panel or a liquid crystal display (LCD) panel.

* * * * *